(12) United States Patent
Bondoux et al.

(10) Patent No.: US 8,821,961 B2
(45) Date of Patent: Sep. 2, 2014

(54) MGO-BASED COATING FOR ELECTRICALLY INSULATING SEMICONDUCTIVE SUBSTRATES AND PRODUCTION METHOD THEREOF

(75) Inventors: Céline Bondoux, Versailles (FR); Philippe Prene, Artannes sur Indre (FR); Philippe Belleville, Tours (FR); Robert Jerisian, Tours (FR)

(73) Assignee: Commissariat a l'Energie Atomique, Paris (FR)

( * ) Notice: Subject to any disclaimer, the term of this patent is extended or adjusted under 35 U.S.C. 154(b) by 1092 days.

(21) Appl. No.: 11/664,765

(22) PCT Filed: Oct. 12, 2005

(86) PCT No.: PCT/FR2005/050844
§ 371 (c)(1), (2), (4) Date: Mar. 3, 2008

(87) PCT Pub. No.: WO2006/040499
PCT Pub. Date: Apr. 20, 2006

(65) Prior Publication Data
US 2008/0258270 A1    Oct. 23, 2008

(30) Foreign Application Priority Data
Oct. 13, 2004 (FR) .................................. 04 10789

(51) Int. Cl.
| | |
|---|---|
| *B05D 5/12* | (2006.01) |
| *H01L 23/58* | (2006.01) |
| *H01L 21/469* | (2006.01) |
| *H01L 21/02* | (2006.01) |
| *C23C 16/40* | (2006.01) |
| *H01L 23/532* | (2006.01) |

(52) U.S. Cl.
CPC ........ *H01L 21/02107* (2013.01); *C23C 16/403* (2013.01); *H01L 23/5329* (2013.01); *H01L 21/02282* (2013.01); *H01L 21/02172* (2013.01)
USPC .............................. 427/58; 257/632; 438/778

(58) Field of Classification Search
USPC .............................. 257/632; 427/58; 438/778
See application file for complete search history.

(56) References Cited

U.S. PATENT DOCUMENTS
2,796,364 A  6/1957 Suchoff
5,318,800 A  6/1994 Gong et al.
(Continued)

FOREIGN PATENT DOCUMENTS
EP  1 363 325   11/2003
JP  58130546    8/1983
(Continued)

OTHER PUBLICATIONS

Fu et al., "Preparation and Characterization of MgO Thin Films by a Novel Sol-Gel Method", Nov. 1998, Journal of Sol-Gel Science and Technology.*

(Continued)

*Primary Examiner* — Michael Orlando
(74) *Attorney, Agent, or Firm* — Brinks Gilson & Lione

(57) ABSTRACT

The present invention relates to a magnesium oxide-based (MgO) inorganic coating intended to electrically insulate semiconductive substrates such as silicon carbide (SiC), and to a method for producing such an insulating coating. The method of the invention comprises the steps of preparing a treatment solution of at least one hydrolysable organomagnesium compound and/or of at least one hydrolysable magnesium salt, capable of forming a homogeneous polymer layer of magnesium oxyhydroxide by hydrolysis/condensation reaction with water; depositing the treatment solution of the hydrolysable organomagnesium compound or of the hydrolysable magnesium salt, onto a surface to form a magnesium oxide-based layer; and densifying the layer formed at a temperature of less than or equal to 1000° C.

44 Claims, 2 Drawing Sheets

(56) References Cited

U.S. PATENT DOCUMENTS

| | | | |
|---|---|---|---|
| 5,509,958 | A | 4/1996 | Van De Leest |
| 6,025,608 | A | 2/2000 | Harris et al. |
| 6,091,108 | A | 7/2000 | Harris et al. |
| 6,117,751 | A | 9/2000 | Schoerner et al. |
| 6,133,050 | A | 10/2000 | Azuma et al. |
| 6,149,967 | A | 11/2000 | Mitamura et al. |
| 6,201,280 | B1 | 3/2001 | Bakowski et al. |
| 6,379,783 | B1 | 4/2002 | Kim et al. |
| 6,388,271 | B1 | 5/2002 | Mitlehner et al. |

FOREIGN PATENT DOCUMENTS

| | | |
|---|---|---|
| JP | 60014442 | 1/1985 |
| JP | 63192895 | 8/1988 |
| JP | 03-190984 | 8/1991 |
| JP | 05-283401 | 10/1993 |
| JP | H06-57439 | 1/1994 |
| JP | 08-111177 | 4/1996 |
| JP | 8111177 | 4/1996 |
| JP | 2001110321 | 4/2001 |
| JP | 2001-31681 | 6/2001 |
| JP | 2001279442 | 10/2001 |
| WO | WO 99/26292 | 5/1999 |

OTHER PUBLICATIONS

Patent Abstracts of Japan, vol. 1997, No. 08, JP 09110417 (Apr. 28, 1997).

Bondoux et al., "Sol-gel MgO thin films for insulation on SiC," Materials Science in Semiconductor Processing, vol. 7, No. 4-6, pp. 249-252 (May 24, 2004).

Yoon et al., "Growth of (111) oriented MgO film on Si Substrate by the sol-gel method," Appl. Phys. Lett., vol. 66, No. 20, pp. 2661-2663 (May 15, 1995).

Baudrant, A., et al., Caractérisation et nettoyage du silicium, EGEM, p. 63-93, 2003.

Brandt, C.D., et al., SiC for Applications in High-Power Electronics, Semiconductors and Semimetals, 1998, p. 195-205, vol. 52.

Camassel, J., et al., SiC materials: a semiconductor family for the next century, C. R. Acad. Sci. Paris, 2000, p. 5-21, Série IV.

Kim, T.W., et al., Microstructural and Electrical Properties of MgO Thin Films Grown on p—GaAs (100) Substrates, Materials Research Bulletin, 2001, p. 747-754, vol. 36.

Kim, T.W., et al., Microstructural and electrical properties of MgO thin films grown on p—InP(100) substrates at low temperature, Applied Surface Science, 2001, p. 162-167 vol. 180.

Lee, S.Y., et al., Heteroepotaxial growth of MgO films on Si(001) substrates using cubic SiC as a buffer layer, Journal of Crystal Growth, 2002, p. 635-639, vol. 236.

Lide, D., Physical Constants of Inorganic Compounds, CRC Handbook of Chemistry and Physics, 1990-1991, p. 4-99, vol. 71.

Lipkin, L., et al., Insulator Investigation on SiC for Improved Reliability, IEEE Transactions on Electron Devices, 1999, p. 525-532, vol. 46.

Lipkin, L., et al., SiC Devices with ONO Stacked Dielectrics, Material Science Forum, 2000, p. 1093-1096, vol. 338-342.

Matsuki, N., et al., Fabrication of oxide-gate thin-film transistors using PECVD/PLD multichamber system, Science and Technology of Advanced Materials, 2000, p. 187-190, vol. 1.

Nallet, F., SiC pour l'électronique de puissance du futur, Techniques de l'Ingénieur, 2002, p. RE3-1-RE3-11, vol. 4.

Raynaud, C., Silica films on silicon carbide: a review of electrical properties and device applications, Journal of Non-Crystalline Solids, 2001, p. 1-31, vol. 280.

Roussel, P., Silicon carbide material, devices and applications: evaluating the current market and future trends, Compound Semiconductor, 2003, p. 20-23, September.

Senzaki, J., et al., Characterization of Pb(Zr,Ti)$O_3$ Thin Films on Si Substrates Using MgO Intermediate Layer for Metal/Ferroelectric/Insulator/Semiconductor Field Effect Transistor Devices, Jpn. J. Appl. Phys., 1998, p. 5150-5153, vol. 37.

Senzaki, J. et al., Fabrication and Characterization of Epitaxial MgO Thin Films on Si Substrates, Key Engineering Materials, 1999, p. 167-170, vol. 169-170.

Singh, A., et al., A.C. Electrical Breakdown in Thin Magnesium Oxide Films, Thin Solid Films, 1982, p. 147-150, vol. 87.

Shih, I., et al., Effects of heat treatment on a MgO/Si structure: a possible buffer layer structure for high-$T_c$ superconductors, Materials Letters, 1991, p. 161-163, vol. 11.

Soto, R., et al., Electrical and mechanical properties of MgO thin films on GaAs, Thin Solid Films, 1997, p. 611-614, vol. 308-309.

Yi, J., et al., Amorphous Silicon Crystallization for TFT Applications, Mat. Res. Soc., Symp. Proc., 1994, p. 701-706, vol. 321.

Zetterling, C.-M., et al., Comparison of $SiO_2$ and AlN as Gate Dielectric for SiC MOS Structures, Materials Science Forum, 1998, p. 877-880, vol. 264-268.

\* cited by examiner

MGO-BASED COATING FOR ELECTRICALLY INSULATING SEMICONDUCTIVE SUBSTRATES AND PRODUCTION METHOD THEREOF

This application is a National Stage application of International Application No. PCT/FR2005/050844, filed Oct. 12, 2005, the entire contents of which are hereby incorporated herein by reference. This application also claims priority under 35 U.S.C. § 119 to French Patent Application No. 0410789 filed Oct. 13, 2004, the entire contents of which is hereby incorporated herein by reference.

TECHNICAL FIELD

The present invention relates to an inorganic magnesium oxide-based (coating) (MgO) for electrically insulating semiconductive substrates such as silicon carbide (SiC), and to a method for producing said insulating coating.

The general field of the invention is therefore that of electrically insulating coatings, more particularly electrically insulating coatings used at high temperatures, and intended for semiconductor/metal insulation and inter-component insulation for microelectronics and more particularly power microelectronics.

The references between ([.]) refer to the list of references given after the examples.

PRIOR ART

The intrinsic physical properties of silicon carbide (SiC) substrates make them a material of choice for producing components for which the conventional silicon (Si) and gallium arsenide (GaAs) chips cannot be used. These are high-temperature and high-frequency fields, where its necessary to deliver high power, or else components operating in a hostile environment, requiring excellent chemical inertness and good radiation resistance. The applications for electronic components on SiC include power diodes (p-n junction rectifiers, Schottky diodes and JBS diodes), thyristors, transistors (MOSFET, MESFET, JFET) and non-volatile RAM memories. In the optoelectronics field, the applications relate to commutation (optical switches) and detection (UV photodetectors).

Despite having properties that are greatly superior to conventional semiconductor materials (silicon and gallium arsenide), carbide has not been able to establish itself in the microelectronics industry for technological reasons. Besides the difficulties encountered in growing crystals of SiC substrates, the electrical insulation makes up the second technological challenge for the integration of microelectronic components.

The insulation requirements necessary for developing integrated circuits relate more particularly to the gate dielectric of field-effect transistors (MOSFET application) whose role is to keep the charge carriers participating in the operation of the device in the semiconductor substrate, and to the insulation or passivation dielectric whose role is to prevent the flow of current between components and the reactions between the semiconductor and the atmosphere or any upper layer, over the entire lifetime of the component.

Various methods are known for producing layers intended for electrical insulation in various microelectronics applications.

The layers, for the most part developed, described for example in the documents [1], [2] and [3], are based on silica ($SiO_2$) and make it possible to fulfil the requirements in terms of the gate dielectric and inter-component insulation or passivation in respect of silicon chips. However, due to the continuity of the electric field at the insulator/semiconductor interface, as described in document [4], the intrinsic properties of the silica (dielectric permittivity and breakdown field) result in the generation, in the insulating layer, of an electric field 2.5 times higher than in the semiconductor. Since the breakdown field of SiC is 2 MV/cm, the stress undergone by the silica becomes too high to guarantee the reliability of the components: the lifetime of the silica subjected to a field of 5 MV/cm drops from 10 years to 1000 seconds on passing from an operating temperature of 25° C. to 350° C. Thus, the operating voltage ranges of the SiC components are limited by the breakdown of the dielectric insulator, thus preventing the potentialities of SiC from being fully exploited.

Silicon nitride ($Si_3N_4$) and aluminium nitride (AlN) have also been proposed to replace silica as insulating materials on SiC, as described for example in documents [5] and [6]. Despite a high breakdown field, respectively 5-10 and 6-15 MV/cm [7], the dielectric permittivity of these materials, respectively 7.5 and 8.5 [8], is below that of the SiC, limiting the operating voltage ranges of the components on SiC.

Alumina ($Al_2O_3$) may also be used as an electrically insulating material for microelectronics, as described for example in document [9]. The dielectric permittivity of alumina is of the order of magnitude of that of SiC, but its low breakdown field (about 5 MV/cm according to [8]) also limits the operating voltage ranges of the components on SiC.

Methods using materials having complex chemical compositions are also known, as described in documents [10], [11] and [12], or a stack of layers of the previously described materials, as described in documents [13] and [14]. However, the processing of such insulating layers is complicated and requires, in the second case, long production times.

In addition, methods are known for preparing layers of MgO intended for plasma screen applications. Examples of these can be found in documents [15] to [19]. In this case, the desired properties are the secondary electron emission coefficient and the plasma ignition threshold and the conditions for preparing the coating are optimized for these characteristics.

It is also possible to find coatings based on MgO used as a buffer layer for the epitaxy of perovskite films on silicon, as described in documents [20] to [23], or III-V semiconductor substrates, as described in documents [24] to [26], or else as gate oxide, as described in documents [27] and [28], for thin film transistors (TFTs). These MgO layers are generally prepared by vacuum evaporation (PVD) or by laser ablation, which are processing techniques that are difficult to integrate into a microelectronics production line.

Document [29] also describes the conditions for preparing MgO layers from a magnesium alcoholate, intended to isolate magnetic components. In this case, the desired properties are a high electrical resistance, a high thermal stability (up to 1200° C.) and good adhesion to the substrate. The conditions for preparing the coating have been optimized for these characteristics.

Thus, one or more of the following drawbacks emerge from the embodiments of the prior art:
  the restricted use of the potentialities of SiC due to the intrinsic properties of the materials in the form of thin films (breakdown field and dielectric permittivity) ensuring the electrical insulation. The operating voltage ranges of the components are limited by the breakdown of the insulator, and not by the intrinsic properties of the SiC substrate;

a complicated implementation for producing insulating coatings having complex chemical compositions or in the form of a multilayer stack;

the optimization of methods for manufacturing coatings based on MgO for properties other than a high breakdown field and a high dielectric permittivity for low leakage currents; and the difficulties in integrating the vacuum deposition methods mentioned into a microelectronics production line.

SUMMARY OF THE INVENTION

The present invention has been carried out in view of the circumstances described above, and its first object is to supply a coating intended to electrically insulate semiconductor substrates, preferably made from silicon carbide (SiC), free from all the abovementioned drawbacks.

Another object of the present invention is to supply an electronically insulating inter-component interface for an electronic or optoelectronic component, free from all the abovementioned drawbacks.

Another object of the present invention is to supply a method for coating a substrate that is easy to implement and can be integrated perfectly into a microelectronics production line.

Another object of the present invention is to supply a method that can be used for manufacturing an electronic or optoelectronic component, free from all the abovementioned drawbacks.

These objects are achieved by the present invention, which provides a method for producing an electronically insulating inorganic coating, or layer, based on magnesium oxide (MgO), comprising the following steps:

(a) preparing a treatment solution of at least one hydrolysable organomagnesium compound and/or of at least one hydrolysable magnesium salt, capable of forming a homogeneous polymer layer of magnesium oxyhydroxide by hydrolysis/condensation reaction with water;

(b) depositing the treatment solution of the hydrolysable organomagnesium compound or of the hydrolysable magnesium salt onto a surface in order to form a magnesium oxide-based layer; and (c) densifying the layer formed at a temperature of less than or equal to 1000° C. in order to obtain the magnesium oxide-based insulating layer.

These objects are also achieved by the present invention, which provides a method for coating a surface of a conductive or semiconductive substrate with an electronically insulating inorganic layer, or coating based on magnesium oxide, said method comprising the following steps:

(a) preparing a treatment solution of at least one hydrolysable organomagnesium compound and/or of at least one hydrolysable magnesium salt capable of forming a homogeneous polymer layer of magnesium oxyhydroxide by hydrolysis/condensation reaction with water;

(aa) optionally, preparing the surface of the substrate to be coated in order to improve the adhesion and/or the electrical insulation and/or the abrasion resistance properties of the magnesium oxide-based insulating layer;

(b') depositing the treatment solution of the hydrolysable organomagnesium compound or of the hydrolysable magnesium salt onto the surface of the substrate, optionally prepared via step (aa), in order to form a magnesium oxide-based layer; and (c) densifying said layer formed at a temperature of less than or equal to 1000° C. in order to obtain the magnesium oxide-based insulating layer.

Indeed, after having carried out in-depth research to attain the aforementioned objects, the inventors of the present invention have discovered, quite unexpectedly, that if a deposit of magnesium oxide is densified at a temperature less than or equal to 1000° C., the dielectric properties of the densified material are greatly improved relative to the insulating layers of the prior art. They have indeed obtained, thanks to the method of their invention, magnesium oxide-based insulating layers having a resistance of 318 GΩ (318 gigaohms), compared with the 3 kΩ (3 kiloohms) obtained with the method of the prior art described in U.S. Pat. No. 2,796,364 mentioned above.

In addition, advantageously, the magnesium oxide gives good performance in terms of breakdown field, dielectric permittivity and leakage current, making it possible to fully exploit the potentialities of a material such as SiC. This is because, generally, the magnesium oxide has intrinsic properties, a breakdown field of around 10 MV/cm as described in document [30] and a dielectric permittivity of around 10, as described in document [30b].

In the remainder of the description, the term "surface" denotes any surface on which the method of the invention may be implemented. It may be a surface of a "substrate" within the meaning of the present invention, or a surface made from a material deposited onto a support or a surface solely allowing manufacture of the coating. According to the invention, the surface may be "single" or "mixed", that is to say made from a single material, or from several materials present side by side on the plane formed by the surface.

The term "substrate" generally denotes a support on which the method of the invention is implemented.

According to the invention, the substrate may be made, for example, from one of the conductive or semiconductive materials used in the field of microelectronics. It may be, for example a material chosen from the group comprising silicon (Si), silicon carbide (SiC), gallium arsenide (AsGa), indium phosphide (InP), gallium nitride (GaN), diamond (C) or germanium (Ge). In the method of the invention, the at least one surface of the substrate may therefore be made from one or more of these materials (single or mixed surface).

According to the invention, the substrate may also be metal. It may be made, for example, from a material chosen from the group comprising steels, aluminium, zinc, nickel, iron, cobalt, copper, titanium, platinum, silver and gold; or else from an alloy of these metals; or else from an alloy chosen, for example, from the group comprising brass, bronze, aluminium or tin. In the method of the invention, the at least one surface of the substrate may therefore be made from one or more of these metals or alloys of these metals (single or mixed surface).

According to the invention, the "surface" of the substrate may also denote a surface made from a material deposited onto a support. The support may be made, for example, from one of the aforementioned materials. The deposited material may be, for example, made from a metal or metal oxide layer or from a stack of metal and/or metal oxide layers or from a mixed metal and/or metal oxide layer or else from an electronic component onto which the layer based on magnesium oxide is deposited, for example with the aim of ensuring an inter-layer and/or inter-component electrical insulation function. The metal and/or metal oxide layers may be, for example, layers made from one or more metals such as those already mentioned, or from a metal alloy such as those already mentioned, or from one or more oxides of one or more of these metals.

The term "magnesium oxide-based" is understood to mean an electrical insulating layer that may be composed of magnesium oxide alone or from a mixture of magnesium oxide and of one or more magnesium salts and/or of one or more metal or metalloid oxides or organometallic compounds (referred to below as (I), (II) and (III) respectively). The structure of the magnesium oxide-based layer may be amorphous, in that case it is referred to as being "glassy". It may also be crystalline, that is to say made from one or more crystallites corresponding to areas in which a three-dimensional long-range order of the atoms is established.

Step (a) of the method of the invention therefore consists in preparing a treatment solution of at least one hydrolysable organomagnesium compound and/or of at least one hydrolysable magnesium salt, capable of forming a homogeneous polymer layer, or film, of magnesium oxyhydroxide by hydrolysis/condensation reaction with water. This solution is also known as the "treatment solution" hereinafter.

In this solution, the hydrolysable organomagnesium compound and/or the at least one hydrolysable magnesium salt constitutes one or more of the molecular precursors of magnesium oxide.

According to the invention, this treatment solution may be obtained, for example, by dissolving, in a solvent, a first molecular compound of magnesium with the general chemical formula (I):

$$X_y X'_z Mg \quad (I)$$

wherein X and X' are chosen independently from:
- a hydrolysable group, for example an alcoholate of formula O—$R^1$, in which $R^1$ is a linear or branched alkyl group having from 1 to 10 carbon atoms;
- a complexing agent, for example a carboxylate, for example of formula $R^2$—COOH, in which $R^2$ is a linear or branched alkyl group having from 1 to 30 carbon atoms, preferably from 1 to 10 carbon atoms, or a phenyl group; or
- a β-diketone or a derivative of a β-diketone, for example of formula $R^3$—$COCH_2CO$—$R^4$, in which $R^3$ and $R^4$ are chosen independently from a linear or branched alkyl group having from 1 to 30 carbon atoms, preferably from 1 to 10 carbon atoms, or a phenyl group;

wherein y and z represent respectively the stoichiometry of X and X' and are such that the first molecular compound is an electrically neutral compound.

Examples of compounds (I) that can be used in the present invention are described, for example, in documents [37] to [39].

According to the invention, the alcoholate may be, for example, a magnesium methylate, ethanolate or propylate.

The solvent may be any solvent known to a person skilled in the art for preparing a sol. According to the invention, the solvent is advantageously organic. According to the invention, it may advantageously be chosen from among the saturated or unsaturated aliphatic alcohols of formula $R^5$—OH, in which $R^5$ represents an alkyl group having from 1 to 30 carbon atoms, or a phenyl group, or else a diol of formula HO—$R^6$—OH, in which $R^6$ represents an alkyl group having from 1 to 30 carbon atoms, preferably 1 to 10 carbon atoms, or a phenyl group.

The solvent may be, for example, chosen from the group comprising methanol, ethanol, isopropanol, butanol, pentanol and glycol, for example ethylene glycol and triethylene glycol. Advantageously, the solvent is methanol or ethanol which volatilizes easily.

As an example of the hydrolysable group, mention may be made, for example, of magnesium methoxyethoxide (Mg(OCH$_2$CH$_2$OCH$_3$)$_2$).

As examples of the complexing agent, mention may be made, for example, of magnesium acetate tetrahydrate (Mg(CH$_3$COO)$_2$.4H$_2$O) and magnesium lactate trihydrate Mg(CH$_3$CHOHCOO)$_2$.3H$_2$O.

As an example of the β-diketone, mention may be made, for example, of magnesium 2,4-pentanedionate (Mg(CH$_3$COCHCOCH$_3$)$_2$).

As examples of the first molecular compound, a compound can be used that is chosen from the group comprising magnesium dimethoxide (Mg(OCH$_3$)$_2$), magnesium diethoxide (Mg(OCH$_2$CH$_3$)$_2$) and magnesium di-n-propoxide (Mg(OCH$_2$CH$_2$CH$_3$)$_2$).

For example, advantageously, as the first molecular compound of magnesium it is possible to use magnesium dimethoxide (Mg(OCH$_3$)$_2$) dissolved in methanol (CH$_3$OH) or magnesium diethoxide (Mg(OCH$_2$CH$_3$)$_2$) dissolved in ethanol (CH$_3$CH$_2$OH).

According to the present invention, one or more magnesium salts of formula (II) may advantageously be added to the treatment solution:

$$MgA_2 \quad (II)$$

in which A is a halide ion, for example Br or Cl, or a nitrate ion. The magnesium salt has the role of controlling the orientation of the periclase (MgO) crystallites and thus of further improving the electrical insulation properties of the magnesium oxide-based insulating layer of the present invention. This magnesium salt may also be referred to as the second molecular compound of magnesium.

Examples of magnesium salts (II) that can be used in the present invention are described, for example in documents [37] to [39].

The magnesium salt (II) may be mixed in an amount ranging from 0 to 99% by weight relative to the first molecular compound of magnesium that forms the inorganic polymer network of the coating, preferably from 0 to 25% by weight.

For example, according to the invention, anhydrous magnesium dichloride (MgCl$_2$) will preferably be mixed in an amount ranging from 0 to 25% by weight (MgO equivalents) relative to the magnesium dimethoxide (Mg(OCH$_3$)$_2$).

Preferably, the magnesium salt (II) is in anhydrous form.

Advantageously, the magnesium salt is dissolved in an organic solvent. According to the invention, the solvent may be chosen advantageously from the aforementioned aliphatic alcohols. The solvent may be, for example, chosen from the group comprising methanol, ethanol, isopropanol, butanol and pentanol. Advantageously the solvent is methanol or ethanol.

According to the invention, it is possible to use, for example, as the magnesium salt, anhydrous magnesium dichloride (MgCl$_2$) or magnesium dibromide (MgBr$_2$) dissolved for example in methanol (CH$_3$OH) or in ethanol (CH$_3$CH$_2$OH).

According to the present invention, it is also possible to add to the treatment solution, in addition to or in the absence of the aforementioned magnesium salt, one or more metal or metalloid salts or organometallic compounds of general chemical formula (III):

$$E_t M_u \quad (III)$$

in which:
M is a metal or a metalloid;
E is a group chosen from:
a hydrolysable group, for example chosen from the group comprising a halide, such as a fluoride, chloride, bromide or iodide; a nitrate; an oxalate; an alcoholate of formula O—$R^6$ where $R^6$ is an alkyl group having 1 to 10 carbon atoms;

a complexing agent such as a carboxylate of formula $R^7$—COOH, in which $R^7$ is a linear or branched alkyl group having from 1 to 30 carbon atoms, preferably from 1 to 10 carbon atoms, or a phenyl group;

a β-diketone or a derivative of β-diketone, for example of formula $R^8$—COCH$_2$CO—$R^9$, in which $R^8$ and $R^9$ are chosen independently from a linear or branched alkyl group having from 1 to 30 carbon atoms, preferably from 1 to 10 carbon atoms, or a phenyl group;

a phosphonate, for example chosen from the group comprising $R^{10}$—PO(OH)$_2$, $R^{11}$—PO(OR$^{12}$)(OH) or $R^{13}$—PO(OR$^{14}$)(OR$^{15}$) with $R^{10}$, $R^{11}$, $R^{12}$, $R^{13}$, $R^{14}$ and $R^{15}$ being identical or different, linear or branched alkyl groups having from 1 to 30 carbon atoms, preferably from 1 to 10 carbon atoms, or a phenyl group;

a hydroxamate of formula $R^{16}$—CO(NHOH), in which $R^{16}$ is a linear or branched alkyl group having from 1 to 30 carbon atoms, preferably from 1 to 10 carbon atoms, or a phenyl group;

an organosilane;

a sulphonate;

a borate; or a diol of formula HO—$R^{16}$—OH, wherein $R^{16}$ is a linear or branched alkyl group having from 1 to 30 carbon atoms, preferably from 1 to 10, or a phenyl group;

in which t and u respectively represent the stoichiometry of E and M and are such that the compound (III) is an electrically neutral compound.

Examples of compounds (III) that can be used in the present invention are described, for example in documents [37] to [39].

According to the invention, a mixture of compounds (III) can also be used.

The compound (III) has the role of slowing down the crystallization of the magnesium oxide-based insulating layer (I) and thus of controlling the insulation properties.

According to the invention, the compound (III) may be added to the treatment solution, for example, in an amount ranging from 0 to 99% by weight relative to the magnesium salt (I) that forms the inorganic polymer network of the coating, advantageously between 0 and 50% by weight.

The metal or metalloid M, may be chosen from:

transition metals Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt;

lanthanides La, Ce, Pr, Nd, Sm, Eu, Gd, Tb, Dy, Er, and Yb;

group III elements chosen from Al, Ga, In and Tl;

group IV elements chosen from Si, Ge, Sn and Pb;

group V elements such as Sb;

group VI elements chosen from Se and Te;

alkali metals chosen from Li, Na, K and Cs; and alkaline earth metals chosen from Be, Ca, Sr and Ba.

It may also be any combination or mixture of elements chosen from the transition metals, alkali and alkaline earth metals, lanthanides, group III elements, group IV elements, group V elements and group VI elements.

Advantageously, a compound $E_tM_u$ (III) based on silicon or calcium will be chosen.

In an advantageous but optional manner, before or after preparing the treatment solution, the preparation is carried out of the at least one surface where the electronically insulating layer according to the invention will be deposited (step (aa)).

The cleaning procedure is preferably adapted to the type, size and shape of the substrate. The choice of the cleaning procedure is within the scope of a person skilled in the art.

For example, for preparing a surface of a semiconductor material such as those conventionally used in the field of microelectronics, the procedures described in the work [31] may be used in implementing the method of the invention. This surface preparation makes it possible to appreciably improve the adhesion, electrical insulation and abrasion resistance properties of the magnesium oxide-based insulating layer of the invention.

The following step (b) or (b') consists in applying, from the treatment solution, the magnesium oxide-based layer to the prepared or unprepared surface. Generally, whichever deposition technique is used, the deposited layer is preferably uniform.

Depositing the layer based on magnesium oxide may be carried out, for example, using one of the following liquid processing techniques:

dip coating;

spin coating;

sputtering;

laminar-flow coating;

spray coating;

slip coating; or techniques using a horizontal blade to carry out the deposition (tape coating).

According to the invention, spin coating is preferably used as it can be easily integrated into a microelectronics production line.

Finally, the last step (c) of the method of the invention consists in densifying the deposited magnesium oxide-based layer. This step may be implemented by any densification or crosslinking method enabling the desired crosslinking to be carried out at room temperature or at a moderate temperature, provided that the temperature is less than or equal to 1000° C. It makes it possible to obtain an inorganic magnesium oxide-based material that forms the electronically insulating layer of the present invention.

For example, this step may be implemented by a treatment of the magnesium oxide-based insulating layer (I) chosen from:

a heat treatment, for example in an oven or by infrared exposure or using a hotplate;

a UV exposure treatment;

a laser beam irradiation treatment;

an electron or ion beam treatment; or a microwave energy treatment.

A mixture of these treatments may also be applied. For example, the treatment used may be chosen for economic and/or speed reasons, and as a function of the constraints imposed by the support.

According to the invention, when the densification or crosslinking is carried out via a heat treatment, for example in a muffle furnace, the treatment may consist, for example, in heating the deposited layer to a moderate temperature, for example between 400° C. and 1000° C., preferably from 650 to 750° C., for example around 700° C. The heating may be carried out in air or under an inert gas, for example under nitrogen or argon. Heating via exposure to infrared or near infrared radiation also enables the surface of the substrate to be heated to a temperature between 400° C. and 1000° C., preferably from 650 to 750° C., for example around 700° C. Here too, the heating may be carried out in air or under an inert gas, for example under nitrogen or argon.

The heating time is that which enables the desired densification to be obtained under the heating conditions of the invention. Generally, it is from 2 to 150 minutes, preferably from 5 to 60 minutes. For example, good crosslinking may be obtained after 15 minutes at 700° C.

According to the invention, when the densification or crosslinking is carried out by exposure to UV rays, the wavelength of the UV rays is generally between 180 and 350 nm. This technique can advantageously be applied at room temperature (generally 15 to 35° C.).

The exposure time is that which enables the desired densification to be obtained under the temperature conditions of the treatment. Generally it is from 1 to 30 minutes, preferably from 1 to 5 minutes. For example, good crosslinking may be obtained after 5 minutes.

According to the invention, when the densification or crosslinking is carried out by a continuous $CO_2$ laser beam ($\lambda$=10.6 µm) irradiation treatment, 10 to 300 W/cm$^2$, the laser intensity applied is from preferably between 50 and 150 W/cm$^2$ for several seconds, generally from 1 to 10 seconds, with a 15 kW continuous laser.

In order for the electrical insulating effect to work, the final thickness of the magnesium oxide-based insulating layer of the present invention, after densification, is preferably between 10 and 500 nm, advantageously 50 to 200 nm, for example 100 nm. Preferably, the insulating layer has a uniform thickness.

Generally, the substrates covered by the magnesium oxide-based layer prepared according to the invention positively fulfil the requirements needed for the envisaged applications, such that the electrical insulation of semiconductor substrates, more particularly of silicon carbide (SiC), or else the intercomponent electrical insulation, namely:

has a high breakdown field, greater than 5 MV/cm;
has a resistance which may easily reach 318 GΩ, and generally situated between 200 and 700 GΩ;
has an electrical permittivity close to the bulk material, generally between 9 and 11 (for example ∈=10); and
has a low leakage current, even at high temperature, generally less than $10^{-8}$ A/cm$^2$ at 25° C. and less than $10^{-5}$ A/cm$^2$ at 250° C.

In addition, the method for preparing the magnesium oxide-based insulating coating according to the invention is simple, not very costly, and can be integrated into a microelectronics production line.

The present invention therefore also relates to an electronically insulating inorganic layer capable of being obtained by the method of the invention, in particular to a layer having the aforementioned characteristics.

Furthermore, it may be applied onto complex-shaped supports, that is to say onto non-planar surfaces.

In fact, as a person skilled in the art will have understood, the present invention astutely combines the use of a coating based on magnesium oxide (MgO) produced via a sol-gel method and deposited by liquid processing with a densification treatment at a temperature of less than or equal to 1000° C. to solve all the problems of the prior art.

The applications of the present invention are very numerous, as explained above. Among these applications, mention may be made, for example and in a non-exhaustive manner, of the following:

Component applications in microelectronics. Reference may be made, for example, to the documents [32], [33], [34] and [35] that describe devices and their manufacturing methods in which the present invention may be used. To this end, the method of the invention is used for electrical insulation instead of silica ($SiO_2$), aluminium nitride (AlN), silicon nitride ($Si_3N_4$) or silicon oxynitride (SiON).

Insulating gate and passivation applications. Reference may be made, for example, to the document [36] that describes devices and their manufacturing methods in which the present invention may be used. To this end, the method of the invention is used for electrical insulation instead of silica ($SiO_2$), aluminium nitride (AlN), silicon nitride ($Si_3N_4$) or silicon oxynitride (SiON).

Consequently, the present invention also relates to the use of the method of the invention to manufacture an electronically insulating semiconductor/metal interface for an electronic or optoelectronic component.

Consequently, the present invention also relates to the use of the method of the invention to produce an electronically insulating inter-component interface for an electronic or optoelectronic component.

Consequently, the present invention also relates to the use of the method of the invention in the manufacture of an electronic component chosen from the group consisting of power diodes, thyristors, transistors and non-volatile RAM memories.

Consequently, the present invention also relates to the use of the method of the invention in the manufacture of an optoelectronic component chosen from the group consisting of switches and detectors.

In particular, the present invention finds very many applications in the manufacture of electronic components on SiC, for example power diodes (p-n junction rectifiers, Schottky diodes and JBS diodes), thyristors, transistors (MOSFET, MESFET, JFET) and non-volatile RAM memories. In the optoelectronics field, the applications relate to commutation (optical switches) and detection (UV photodetectors).

Other features will become more apparent to a person skilled in the art on reading the following examples, given by way of illustration and in a non-limiting way, with reference to the appended drawings.

EXAMPLES

Example 1

Figure 1:
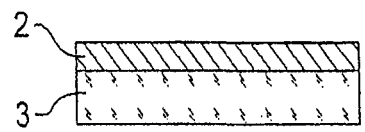
FIG. 1 is a schematic cross-sectional view of a substrate after deposition of the magnesium oxide-based insulating layer according to the invention.

Method for Producing an Insulating Magnesium Oxide Layer According to the Invention This example was carried out on a silicon wafer, of which the surface to be coated by the method of the invention was covered with a layer of platinum. The treatment solution was a solution based on a mixture of $Mg(OCH_3)_2$ and $MgCl_2$ in an 80/20 weight ratio.

The treatment solution was prepared according to the following procedure:

1. The anhydrous magnesium dichloride ($MgCl_2$, sold by Fluka under the reference 63,063), was dissolved, with magnetic stirring, in Normapur (trademark) methanol ($CH_3OH$, sold by VWR under the reference 20,847) to a concentration in MgO weight equivalents between 3 and 4%. Stirring of this clear and transparent solution, which will be identified as $MgCl_2/CH_3OH$ in this example, was maintained for 30 minutes.

2. The $MgCl_2/CH_3OH$ solution was then mixed, using magnetic stirring, with a solution of magnesium dimethoxide dispersed in methanol ($Mg(OCH_3)_2/CH_3OH$, 6-10 wt %, sold by Aldrich under the reference 33,565-7). The weights of the $MgCl_2/CH_3OH$ and $Mg(OCH_3)_2/CH_3OH$ solutions added were calculated so as to have an $Mg(OCH_3)_2/MgCl_2$ weight ratio of 80/20 in MgO equivalents. After stirring for 30 minutes, a clear and transparent treatment solution was obtained.

The synthesis was entirely carried out in an atmosphere free from moisture (dry glove box) or under a stream of dry gas (argon) in order to avoid any prehydrolysis of the particularly water-sensitive magnesium precursors.

A silicon wafer (diameter: 5.1 mm) covered with a layer of platinum (thickness: ≈100 nm) deposited by high temperature physical evaporation, was first of all cleaned with acetone, then dried with absolute ethanol.

The treatment solution of the invention was deposited by spin coating at 21° C. with a controlled relative humidity (45±5%). The treatment solution was filtered (0.45 μm polypropylene single-use filter sold by Whatman) when injecting it onto the platinum surface. The silicon wafer was then rotated at a speed of 2000 rpm for 1 minute.

The magnesium oxide-based layer obtained was wiped over a surface of 0.5 cm$^2$ using a cotton bud soaked in a (1M) aqueous solution of hydrochloric acid.

The magnesium oxide-based layer was then densified in a muffle furnace, with a hold at 700° C. for one hour, with a temperature increase ramp of 10° C./min.

After the densification step, the thickness of the magnesium oxide-based layer was 100 nm.

FIG. 1 is a schematic representation of the substrate (3) coated by the insulating layer (2).

Gold studs with a diameter of 200 μm were then deposited onto the magnesium oxide-based layer by high temperature physical evaporation using a suitable screen.

The electrical characterizations were then measured using the platinum layer and the gold studs located on both sides of the densified, magnesium oxide-based insulating layer (electrical structure: metal/insulating layer of the invention/metal).

Breakdown Field

Figure 2:
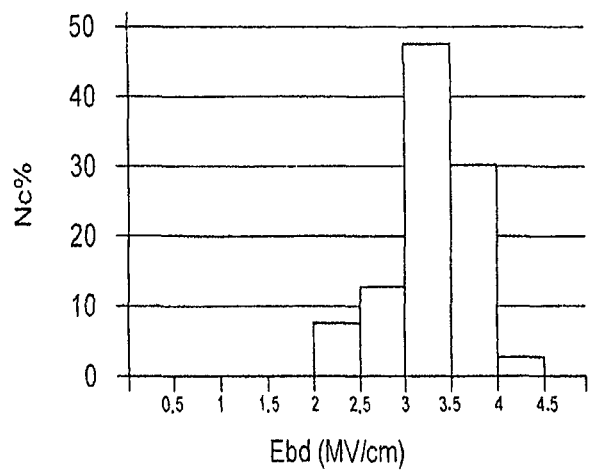
FIG. 2 is a diagram representing the breakdown field distribution at room temperature as a function of the electrical field applied, in MV/cm, to a magnesium oxide-based insulating layer, deposited on a layer of platinum and prepared according to the invention.

The appended FIG. 2 gives the breakdown field distribution at room temperature as a function of the electrical field applied, in MV/cm, to the magnesium oxide-based insulating layer, deposited on a layer of platinum and prepared according to Example 1.

The average value of the breakdown field was 3.4 MV/cm.

Leakage Current

Figure 3:
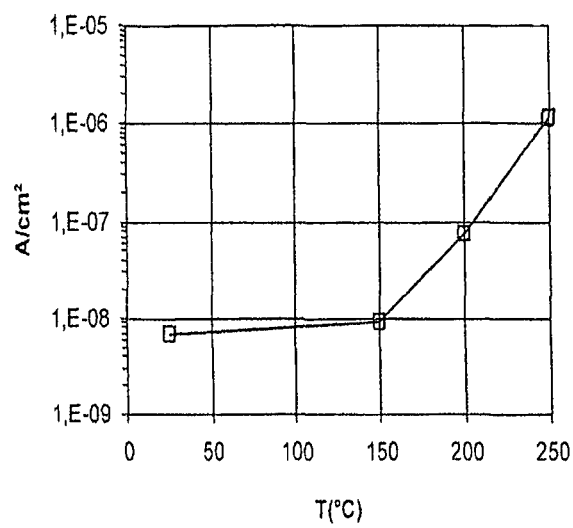
FIG. 3 is a graph representing the change in the leakage current density in A/cm$^2$ at 1 MV/cm as a function of the measurement temperature in ° C. of a magnesium oxide-based insulating layer, deposited and densified according to the invention on a layer of platinum.

FIG. 3 shows the change in the leakage current density in A/cm$^2$ at 1 MV/cm as a function of the measurement temperature in ° C. of the magnesium oxide-based insulating layer deposited on a layer of platinum and prepared according to Example 1.

Between room temperature and 250° C., the leakage current increased from $8 \times 10^{-9}$ to $1 \times 10^{-6}$ A/cm$^2$.

Example 2

Method for Producing an Insulating Magnesium Oxide Layer from a Treatment Solution Based on $Mg(OCH_3)_2$ According to the Invention The treatment solution was prepared by diluting magnesium dimethoxide dispersed in methanol ($Mg(OCH_3)_2/CH_3OH$, 6-10 wt %, sold by Aldrich under the reference 33, 565-7) in Normapur (trademark) methanol ($CH_3OH$, sold by VWR under the reference 20,847) so as to obtain a weight concentration of 2.5% in MgO weight equivalents.

The layer based on magnesium oxide was deposited on three different types of supports: a silicon wafer (diameter: 5.1 mm) covered with a layer of platinum (thickness: ≈100 nm), a silicon wafer (diameter: 5.1 mm) and a silicon carbide wafer (diameter: 5.1 mm).

The surface of the silicon wafer covered with a layer of platinum was prepared as described in Example 1.

The silicon and silicon carbide wafers were cleaned in the following way:
1st: cleaning with acetone;
2nd: rinsing with deionized water;
3rd: cleaning with ethanol;
4th: rinsing with deionized water;
5th: soaking in an oxidizing bath, corresponding to a mixture of hydrochloric acid (HCl, 37 wt %) and hydrogen peroxide ($H_2O_2$) in water ($H_2O$) in respective volume proportions of 1.5, 1.5 and 5, kept at 70° C. for 15 min. to remove the metal impurities;
6th: rinsing with deionized water;
7th: dipping in a bath of 10 wt % hydrofluoric acid (HF) for 5 min. to remove the silica present at the surface of the substrate;
8th: rinsing with deionized water; and
9th: drying with absolute ethanol by centrifuging.

The treatment solution was deposited on the three substrates by spin coating at 21° C. with a controlled relative humidity (45±5%). The treatment solution was filtered (0.45 μm polypropylene single-use filter, sold by Whatman) when injecting it onto the substrate surface. This substrate was then rotated at a speed of 1500 rpm for 1 minute.

For the silicon wafer covered with a layer of platinum, the magnesium oxide-based layer obtained was wiped over a surface of 0.5 cm$^2$ using a cotton bud soaked in a (1M) aqueous solution of hydrochloric acid.

The magnesium oxide-based layers were then densified in a muffle furnace, with a hold at 700° C. for one hour, with a temperature increase ramp of 10° C./min.

After the densification step, the thickness of the layers based on magnesium oxide was about 100 nm.

In the cases of the silicon and silicon carbide wafers, an ohmic contact made from titanium (Ti) was deposited by high-temperature physical evaporation onto the rear face of the semiconductor substrate that had first been cleaned with 10% hydrofluoric acid (HF).

Gold studs with a diameter of 200 μm were then deposited onto the magnesium oxide-based layer by high temperature physical evaporation using a suitable screen.

The electrical characterizations were then carried out using:
the platinum layer and the gold studs located on both sides of the densified, magnesium oxide-based insulating layer in the case of the silicon wafer covered with a layer of platinum (electrical structure: metal/insulating layer of the present invention/metal); and the ohmic contact made of titanium (Ti) located on the rear face of the semiconductor substrate and the gold studs deposited on the densified magnesium oxide-based insulating layer in the case of the silicon and silicon carbide wafers (electrical structure: metal/insulating layer of the present invention/semiconductor).

Breakdown Field

Figure 4:
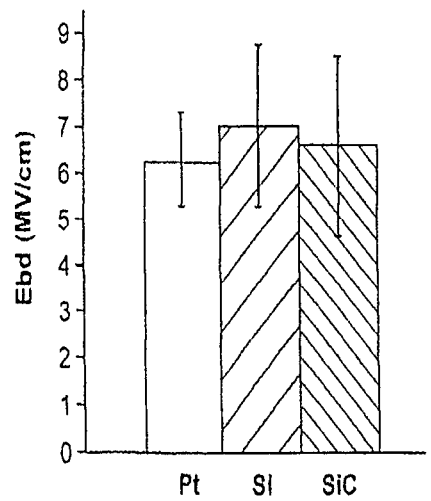
FIG. 4 is a diagram representing the average breakdown field in MV/cm$^2$ at room temperature of a magnesium oxide-based insulating layer, deposited and densified according to the invention, as a function of the type of support.

FIG. 4 is a diagram representing the average breakdown field in MV/cm$^2$ at room temperature of a magnesium oxide-based insulating layer, deposited and densified according to Example 2, as a function of the type of support.

The average value of the breakdown field of the magnesium oxide-based insulating layer does not seem to depend on the type of substrate and is equal to 6.5 MV/cm.

Leakage Current

Figure 5:
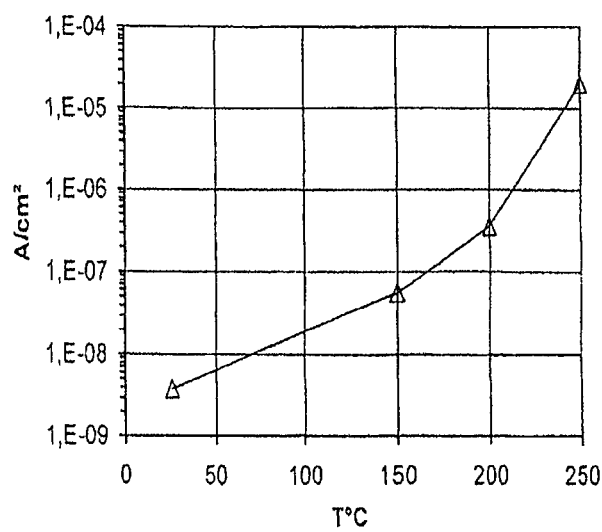
FIG. 5 is a graph representing the change in the leakage current density in A/cm$^2$ at 2 MV/cm as a function of the measurement temperature in ° C. of a magnesium oxide-based insulating layer, deposited and densified according to the invention, on a silicon carbide (SiC) substrate.

FIG. 5 shows a graph representing the change in the leakage current density in A/cm$^2$ at 2 MV/cm as a function of the measurement temperature in ° C. of a magnesium oxide-based insulating layer prepared according to Example 2 on a silicon carbide (SiC) substrate.

Between room temperature and 250° C., the leakage current increased from $3 \times 10^{-9}$ to $2 \times 10^{-4}$ A/cm$^2$.

Example 3

Method for Producing a Magnesium Oxide-Based Insulating Layer and on Calcium Oxide The treatment solution was prepared according to the following procedure:

1. The anhydrous calcium dichloride (CaCl$_2$, sold by Fluka under the reference 21,074) was dissolved, with magnetic stirring, in Normapur (trademark) methanol (CH$_3$OH, sold by VWR under the reference 20,847) to a concentration in CaO weight equivalents between 3 and 4%. Stirring of this clear and transparent solution, which will be identified as CaCl$_2$/CH$_3$OH in this example, was maintained for 30 minutes.

2. The CaCl$_2$/CH$_3$OH solution was then mixed, using magnetic stirring, with a solution of magnesium dimethoxide dispersed in methanol (Mg(OCH$_3$)$_2$/CH$_3$OH, 6-10 wt%, sold by Aldrich under the reference 33, 565-7). The weights of the CaCl$_2$/CH$_3$OH and Mg(OCH$_3$)$_2$/CH$_3$OH solutions added were calculated so as to have an Mg(OCH$_3$)$_2$/CaCl$_2$ weight ratio of 90/10 in oxide equivalents.

After stirring for 30 minutes, a clear and transparent treatment solution was obtained.

The synthesis was entirely carried out in an atmosphere free from moisture (dry glove box) or under a stream of dry gas (typically argon) in order to avoid any prehydrolysis of the particularly water-sensitive magnesium and calcium precursors.

A silicon wafer (diameter: 5.1 mm) covered with a layer of platinum (thickness: ≈100 nm) deposited by high temperature physical evaporation, was first of all cleaned with acetone, then dried with absolute ethanol.

The treatment solution was deposited by spin coating at 21° C. with a controlled relative humidity (45±5%). The treatment solution was filtered (0.45 μm polypropylene single-use filter sold by Whatman) when injecting it onto the platinum surface. The wafer was then rotated at a speed of 2000 rpm for 1 minute.

The magnesium oxide-based layer was then densified in a muffle furnace, with a hold at 700° C. for one hour, with a temperature increase ramp of 10° C./min.

After the densification step, the thickness of the layer based on magnesium oxide and on calcium oxide was about 100 nm.

Example 4

Method for Producing an Insulating Layer Based on Magnesium Oxide and on Silica

1. The solution of silicon tetramethoxide (Si(OCH$_3$)$_4$, sold by ABCR under the reference SIT7510.0) was prepared by dissolving it, with magnetic stirring, in Normapur (trademark) methanol (CH$_3$OH, sold by VWR under the reference 20,847) to a concentration in SiO$_2$ weight equivalents between 3 and 4%. Stirring of this clear and transparent solution, which will be identified as Si(OCH$_3$)$_4$/CH$_3$OH in this example, was maintained for 30 minutes.

2. The Si(OCH$_3$)$_4$/CH$_3$OH solution was then mixed, using magnetic stirring, with a solution of magnesium dimethoxide dispersed in methanol (Mg(OCH$_3$)$_2$/CH$_3$OH, 6-10 wt%, sold by Aldrich under the reference 33, 565-7).

The weights of the Si(OCH$_3$)$_4$/CH$_3$OH and Mg(OCH$_3$)$_2$/CH$_3$OH solutions added were calculated so as to have an Mg(OCH$_3$)$_2$/Si(OCH$_3$)$_4$ weight ratio of 80/20 in oxide equivalents. After stirring for 30 minutes, a clear transparent treatment solution was obtained.

The synthesis was entirely carried out in an atmosphere free from moisture (dry glove box) or under a stream of dry gas (typically argon) in order to avoid any prehydrolysis of the particularly water-sensitive magnesium and silicon precursors.

A silicon wafer (diameter: 5.1 mm) covered with a layer of platinum (thickness: ≈100 nm) deposited by high temperature physical evaporation, was first of all cleaned with acetone, then dried with absolute ethanol.

The treatment solution of the invention was deposited by spin coating at 21° C. with a controlled relative humidity (45±5%). The treatment solution was filtered (0.45 μm polypropylene single-use filter sold by Whatman) when injecting it onto the platinum surface. The wafer was then rotated at a speed of 2000 rpm for 1 minute.

The magnesium oxide-based layer was then densified in a muffle furnace, with a hold at 700° C. for one hour, with a temperature increase ramp of 10° C./min.

After the densification step, the thickness of the layer based on magnesium oxide and on silica was about 100 nm.

Example 5

Comparison of the Breakdown Voltages and the Leakage Currents of Electronically Insulating Layers Obtained from a Pure Hydrolysable Organomagnesium Compound or from a Salts/Organomagnesium Compound Mixture This example gives the results from the electrical characterizations carried out on samples manufactured as in the examples above. These results show an appreciable increase in the breakdown voltage and a significant decrease in the leakage current for the pure hydrolysable organomagnesium compound in comparison with a salt/organomagnesium compound mixture, regardless of the densification temperature of the coating.

|  | Pure organomagnesium compound | | Salts/organomagnesium compound mixture (weight ratio: 20/80) | |
|---|---|---|---|---|
| Densification temperature | Breakdown voltage (MV/cm) | Leakage current at 2 MV/cm at 25° C. (A/cm$^2$) | Breakdown voltage (MV/cm) | Leakage current at 2 MV/cm at 25° C. (A/cm$^2$) |
| 400° C. | 7.1 | $6 \times 10^{-1}$ | 3.6 | $3 \times 10^{-8}$ |
| 500° C. | 6 | $2 \times 10^{-8}$ | | |
| 700° C. | 6 | $3 \times 10^{-9}$ | 3.8 | $3 \times 10^{-8}$ |

LIST OF REFERENCES

[1] U.S. Pat. No. 6,117,751 by Reinhold Shoener et al., filed by Siemens Aktiengesellschaft.
[2] U.S. Pat. No. 6,388,271 by Heinz Mitlehener et al., filed by Siemens Aktiengesellschaft.
[3] U.S. Pat. No. 6,091,108 by Christopher Harris et al., filed by ABB Research Ltd.
[4] L. A. Lipkin and J. W. Palmour, "*Insulator investigation on SiC for improved reliability*", IEEE Trans. On Electron Devices, 46 (3), 1999, p. 525-532.
[5] U.S. Pat. No. 6,201,280 by Mietek Bakowski et al., filed by ABB Research Ltd.
[6] EP-A-1 363 325 by Shuhei Ishikawa et al., NGK Insulators Ltd.
[7] L. A. Lipkin and J. W. Palmour, "*SiC devices with ONO stacked dielectrics*", Materials Science Forum, 338-342, 2000, p. 1093-1096.
[8] C. M. Zetterling, M. Ostling, C. I. Harris, N. Nordell, K. Wongchotigul and M. G. Spencer, "*Comparison of SiO$_2$ and AlN as gate dielectric for SiC MOS structures*", Materials Science Forum, 294-268, 1998, p. 877-880.
[9] JP-A-63192895 by Sawada Kazuo et al., filed by Sumitomo Electric Ind. Ltd.
[10] JP-A-58130546 by Enamoto Akira, filed by Ibigawa Denki Kogyo KK.
[11] JP-A-60014442 by Kobayashi Keiji, filed by Toshiba KK.
[12] JP No. 2001279442 by Itani Tsukasa et al., filed by Fujitsu Ltd.
[13] U.S. Pat. No. 6,025,608 by Christopher Harris et al., filed by ABB Research Ltd.
[14] WO-A-99/26292 by Christopher Harris et al., ABB Research Ltd.
[15] JP-A-8111177 by Yoshihara Toshio et al., filed by Dainippon Printing Co. Ltd.
[16] U.S. Pat. No. 5,509,958 by Renaat E. Van de Leest, filed by US Philips Corporation.
[17] JP No. 2001110321 by Hidaka Soichiro et al., filed by Fujitsu Ltd.
[18] U.S. Pat. No. 6,149,967 by Satoshi Mitamura et al., filed by Dai Nippon Printing Co. Ltd.
[19] U.S. Pat. No. 6,379,783 by Jin Young Kim et al., filed by LG Electronics Inc.
[20] S. Y. Lee, S. H. Lee, E. J. Nah, S. S. Lee and Y. Kim, "*Heteroepitaxial growth of MgO films on Si(001) substrates using cubic SiC as a buffer layer*", Journal of Crystal Growth, 236, 2002, p. 635-639.
[21] J. Senzaki and T. Ueno, "*Fabrication of epitaxial MgO thin films on Si substrates*". Key Engineering Materials, 169-170, 1999, p. 167-170.
[22] J. Senzaki, K. Kurihara, N. Nomura and O. Mitsunaga, "*Characterization of Pb(Zr, Ti)O$_3$ thin films on Si substrates using MgO intermediate layer for Metal/Ferroelectric/Insulator/Semiconductor Field Effect Transistor Devices*", Japanese Journal of Applied Physics, 37-I-9B, 1998, p. 5150-5133.
[23] I. Shih, S. L. Wu, L. Li, C. X. Qiu, P. Grant and M. W. Denhoff, "*Effects of heat treatment on a MgO/Si structure: a possible buffer layer structure for high-Tc superconductors*", Materials Letters, 11, 1991, p. 161-163.
[24] T. W. Kim and Y. S. You, "*Microstructural and electrical properties of MgO thin films grown on p-InP(100) substrates at low temperature*", Applied Surface Science, 180, 2001, p. 162-167.
[25] R. Soto, S. Mergui and P. E. Schmidt, "*Electrical and mechanical properties of MgO thin films on GaAs*", Thin Solid Films, 308-309, 1997, p. 611-614.
[26] T. W. Kim and Y. S. You, "*Microstructural and electrical properties of MgO thin films grown on p-GaAs(100) substrates*", Materials Research Bulletin, 0.36, 2001, p. 747-754.
[27] N. Matsuki, J. Ohta, H. Fujioka, M. Oshima, M. Yoshimmoto and H. Koinuma, "*Fabrication of oxide-gate thin film transistors using PECVD/PLD multichamber system*", Science and Technology of Advanced Materials, 1, 2000, p. 187-190.
[28] J. Yi, R. Wallace, N. Sridhar, D. D. L. Chung and W. A. Anderson, "*Amorphous silicon crystallization for TFT applications*", Materials Research Society Symposia Proceedings, 321, 1994, p. 701-706.
[29] U.S. Pat. No. 2,796,364 by Lydia A. Suchoff et al., filed by Secretary of the Army.
[30] A. Singh and R. Pratap, Thin Solid Films, 87, 1982, p. 147-150.
[30b] Handbook of Chemistry and Physics, 76th Edition, CRC Press, 1995-96.
[31] "Caractérisation et nettoyage du Silicium", Authors: A. Baudrant, F. Tardif and C. Wyon, Hermès Sciences Publications, Paris, 2003.
[32] F. Nallet, "Si pour l'électronique de puissance du futur", Techniques de l'Ingénieur, Collection Electronique, Recherche et Innovation, vol. E1, (2002), RE3.
[33] J. Camassel, S. Contreras, J. L. Robert, "SiC materials: a semiconductor family for the next century", Comptes Rendus de l'Académie des Sciences de Paris, Tome 1, Série IV, (2000), p. 5-21.
[34] Y. S. Park, "SiC Materials and Devices", Semiconductor and Semimetals, Vol. 52, Academic Press, 1998.
[35] P. Roussel, "Silicon Carbide material devices and applications: evaluating the current market and future trends: Compound Semiconductor Three-File and Silicon Heterostructures, Vol. 9, No. 8 (2003), p. 20-23.
[36] C. Raynaud, "Silica films on silicon carbide: a review of electrical properties and device applications", Journal of Non-crystalline Solids, vol. 280, (2001), p. 1-31.
[37] ABCR-Gelest, "Silanes, Silicones and Metal-Organics", ABCR GmbH & Co. KG, postfach 21 01 35, 76151 Karlsruhe, Germany.
[38] VWR, "Réactifs et produits chimiques de laboratoire", VWR International S.A.S. Le Périgares-Bât. B, 201 rue Carnot, 94126 Fontenay-sous-Bois Cedex.
[39] Fluka, "Laboratory Chemicals", Sigma-Aldrich. Chimie SARL, L'Isle d'A'beau Chesnes, B. P. 701, 38297 St Quentin Fallavier Cedex.

The invention claimed is:
1. Method for producing a magnesium oxide-based electronically insulating inorganic layer, said method comprising the following steps:

(a) preparing a treatment solution of at least one hydrolysable organomagnesium compound, capable of forming a homogeneous polymer layer of magnesium oxyhydroxide by hydrolysis/condensation reaction with water;
(b) depositing the treatment solution of the hydrolysable organomagnesium compound onto a surface in order to form a magnesium oxide-based layer; and
(c) densifying the layer formed at a temperature of less than or equal to 1000° C. in order to obtain the magnesium oxide-based insulating layer,
wherein said treatment solution optionally further comprises
(i) one or more magnesium salts of formula (II):

$$MgA_2 \quad (II)$$

in which A is a halide ion; and/or
(ii) one or more metal or metalloid salts or organometallic compounds of general chemical formula (III):

$$E_t M_u \quad (III)$$

in which:
M is a metal or a metalloid;
E is a group chosen from:
  a hydrolysable group;
  a complexing agent;
  a β-diketone or a derivative of β-diketone;
  a phosphonate;
  a hydroxamate of formula $R^{16}$—CO(NHOH), in which $R^{16}$ is a linear or branched alkyl group having from 1 to 30 carbon atoms or a phenyl group;
  an organosilane;
  a sulphonate;
  a borate; or
  a diol of formula HO—$R^{16}$—OH, in which $R^{16}$ is a linear or branched alkyl group having from 1 to 30 carbon atoms, or a phenyl group, wherein t and u, respectively, represent the stoichiometry of E and M such that the compound (III) is an electrically neutral compound;
in a solvent,
wherein the solvent of the treatment solution is an organic solvent selected from the group consisting of a saturated or unsaturated aliphatic alcohol of formula $R^5$—OH, in which $R^5$ represents an alkyl group having from 1 to 30 carbon atoms, or a phenyl group; and a diol of formula HO—$R^6$—OH, in which $R^6$ represents an alkyl group having from 1 to 30 carbon atoms, or a phenyl group.

2. Method according to claim 1, in which the surface is made from a semiconductor or conductor material.

3. Method according to claim 1, in which the surface is made from silicon, silicon carbide, gallium arsenide, indium phosphide, gallium nitride, diamond, germanium, or combinations of these materials.

4. Method according to claim 1, in which the surface is made from silicon carbide.

5. Method according to claim 1, in which the surface is a metal surface.

6. Method according to claim 1, in which the surface is made from steels, aluminum, zinc, nickel, iron, cobalt, copper, titanium, platinum, silver, gold, or an alloy of these metals; or an alloy comprising brass, bronze, aluminum or tin.

7. Method according to claim 1, in which the surface is a mixed surface.

8. Method according to claim 1, in which the treatment solution is obtained by dissolving a molecular compound of magnesium with the general chemical formula (I):

$$X_y X'_z Mg \quad (I)$$

wherein X and X' are chosen independently from:
  a hydrolysable group of formula O—$R^1$, in which $R^1$ is a linear or branched alkyl group having from 1 to 10 carbon atoms;
  a complexing agent of formula $R^2$—COOH, in which $R^2$ is a linear or branched alkyl group having from 1 to 30 carbon atoms, or a phenyl group; or
  a β-diketone or a derivative of a β-diketone of formula $R^3$—COCH$_2$CO—$R^4$, in which $R^3$ and $R^4$ are chosen independently from a linear or branched alkyl group having from 1 to 30 carbon atoms, or a phenyl group;
wherein y and z represent respectively the stoichiometry of X and X' and are such that the first molecular compound is an electrically neutral compound.

9. Method according to claim 8, in which O—$R^1$ is chosen from a methylate, an ethanolate or a propylate.

10. Method according to claim 1, in which the solvent comprises methanol, ethanol, isopropanol, butanol or pentanol.

11. Method according to claim 1, in which the hydrolysable organomagnesium compound is $Mg(OCH_3)_2$, $Mg(OCH_2CH_3)_2$ or $Mg(OCH_2CH_2CH_3)_2$.

12. Method according to claim 10, in which the treatment solution is prepared with methanol or ethanol.

13. Method according to claim 1, in which the magnesium salt is $MgCl_2$ or $MgBr_2$.

14. Method according to claim 1, in which the deposition of the treatment solution is carried out by a liquid processing technique chosen from the group consisting of dip coating, spin coating, sputtering, laminar-flow coating, spray coating, slip coating and techniques using a horizontal blade.

15. Method according to claim 1, in which the densification is carried out by a means chosen from the group consisting of a UV radiation, a heat treatment, a UV exposure treatment, a laser-beam irradiation treatment, an electron or ion beam treatment and a microwave energy treatment.

16. Method according to claim 1, in which the densification is carried out in an oven or via infrared exposure at a temperature of 400 to 1000° C.

17. Method according to claim 16, in which the treatment is carried out for a duration of 2 to 150 minutes.

18. An electronically insulating semiconductor/metal interface of an electronic or optoelectronic component produced by the method according to claim 1.

19. An electronically insulating inter-component interface of an electronic or optoelectronic component produced by the method according to claim 1.

20. Method of manufacturing an electronic component comprising
  producing a magnesium oxide-based electronically insulating inorganic layer for an electronic component according to the method of claim 1,
  wherein the electronic component is chosen from the group consisting of power diodes, thyristors, transistors and non-volatile RAM memories.

21. Method of manufacturing an optoelectronic component comprising
  producing a magnesium oxide-based electronically insulating inorganic layer for an optoelectronic component according to the method of claim 1,
  wherein the optoelectronic component chosen from the group consisting of switches and detectors.

22. Method for coating a surface of a conductive or semiconductive substrate with a magnesium oxide-based electronically insulating inorganic layer, said method comprising the following steps:
(a) preparing a treatment solution of at least one hydrolysable organomagnesium compound capable of forming a homogeneous polymer layer of magnesium oxyhydroxide by hydrolysis/condensation reaction with water;
(aa) optionally, preparing the surface of the substrate to be coated in order to improve the adhesion and/or the electrical insulation and/or the abrasion resistance properties of the magnesium oxide-based insulating layer;
(b') depositing the treatment solution of the hydrolysable organomagnesium compound onto the surface of the substrate, optionally prepared via step (aa), in order to form a magnesium oxide-based layer; and
(c) densifying said layer formed at a temperature of less than or equal to 1000° C. in order to obtain the magnesium oxide-based insulating layer,
wherein said treatment solution further comprises
(i) one or more magnesium salts of formula (II):

$$MgA_2 \tag{II}$$

in which A is a halide ion; and/or
(ii) one or more metal or metalloid salts or organometallic compounds of general chemical formula (III):

$$E_tM_u \tag{III}$$

in which:
M is a metal or a metalloid;
E is a group chosen from:
a hydrolysable group;
a complexing agent;
a β-diketone or a derivative of β-diketone;
a phosphonate;
a hydroxamate of formula $R^{16}$—CO(NHOH), in which $R^{16}$ is a linear or branched alkyl group having from 1 to 30 carbon atoms or a phenyl group;
an organosilane;
a sulphonate;
a borate; or
a diol of formula HO—$R^{16}$—OH, in which $R^{16}$ is a linear or branched alkyl group having from 1 to 30 carbon atoms, or a phenyl group, wherein t and u, respectively, represent the stoichiometry of E and M such that the compound (III) is an electrically neutral compound;
in a solvent,
wherein the solvent of the treatment solution is an organic solvent selected from the group consisting of a saturated or unsaturated aliphatic alcohol of formula $R^5$—OH, in which $R^5$ represents an alkyl group having from 1 to 30 carbon atoms, or a phenyl group; and a diol of formula HO—$R^6$—OH, in which $R^6$ represents an alkyl group having from 1 to 30 carbon atoms, or a phenyl group.

23. Method according to claim 22, in which the surface is made from a semiconductor or conductor material.

24. Method according to claim 22, in which the surface is made from silicon, silicon carbide, gallium arsenide, indium phosphide, gallium nitride, diamond, germanium, or combinations of these materials.

25. Method according to claim 22, in which the surface of the substrate is made from silicon carbide.

26. Method according to claim 22, in which the surface is a metal surface.

27. Method according to claim 22, in which the surface is made from steels, aluminum, zinc, nickel, iron, cobalt, copper, titanium, platinum, silver, gold, or an alloy of these metals; or an alloy comprising brass, bronze, aluminum or tin.

28. Method according to claim 22, in which the surface is a mixed surface.

29. Method according to claim 22, in which the treatment solution is obtained by dissolving, in a solvent, a first molecular compound of magnesium with the general chemical formula (I):

$$X_yX'_zMg \tag{I}$$

wherein X and X' are chosen independently from:
a hydrolysable group of formula O—$R^1$, in which $R^1$ is a linear or branched alkyl group having from 1 to 10 carbon atoms;
a complexing agent of formula $R^2$—COOH, in which $R^2$ is a linear or branched alkyl group having from 1 to 30 carbon atoms, or a phenyl group; or
a β-diketone or a derivative of a β-diketone of formula $R^3$—COCH$_2$CO—$R^4$, in which $R^3$ and $R^4$ are chosen independently from a linear or branched alkyl group having from 1 to 30 carbon atoms, or a phenyl group;
wherein y and z represent respectively the stoichiometry of X and X' and are such that the first molecular compound is an electrically neutral compound.

30. Method according to claim 29, in which O—$R^1$ is chosen from a methylate, an ethanolate or a propylate.

31. Method according to claim 29, in which the solvent comprises methanol, ethanol, isopropanol, butanol or pentanol.

32. Method according to claim 22, in which the hydrolysable organomagnesium compound is Mg(OCH$_3$)$_2$, Mg(OCH$_2$CH$_3$)$_2$ or Mg(OCH$_2$CH$_2$CH$_3$)$_2$.

33. Method according to claim 31, in which the treatment solution is prepared with methanol or ethanol.

34. Method according to claim 22, in which the magnesium salt is MgCl$_2$ or MgBr$_2$.

35. Method according to claim 22, in which the deposition of the treatment solution is carried out by a liquid processing technique chosen from the group consisting of dip coating, spin coating, sputtering, laminar-flow coating, spray coating, slip coating and techniques using a horizontal blade.

36. Method according to claim 22, in which the densification is carried out by a means chosen from the group consisting of a UV radiation, a heat treatment, a UV exposure treatment, a laser-beam irradiation treatment, an electron or ion beam treatment and a microwave energy treatment.

37. Method according to claim 22, in which the densification is carried out in an oven or via infrared exposure at a temperature of 400 to 1000° C.

38. Method according to claim 37, in which the treatment is carried out for a duration of 2 to 150 minutes.

39. An electronically insulating semiconductor/metal interface of an electronic or optoelectronic component produced by the method according to claim 22.

40. An electronically insulating inter-component interface of an electronic or optoelectronic component produced by the method according to claim 22.

41. Method of manufacturing an electronic component comprising
producing a magnesium oxide-based electronically insulating inorganic layer for an electronic component according to the method of claim 22,
wherein the electronic component is chosen from the group consisting of power diodes, thyristors, transistors and non-volatile RAM memories.

42. Method of manufacturing an optoelectronic component comprising
producing a magnesium oxide-based electronically insulating inorganic layer for an optoelectronic component according to the method of claim 22,
wherein the optoelectronic component chosen from the group consisting of switches and detectors.

43. Electronically insulating inorganic layer obtained by the method of claim 1.

44. Method for coating a surface of a conductive or semiconductive substrate with a magnesium oxide-based electronically insulating inorganic layer, said method comprising the following steps:
(a) preparing a treatment solution of at least one hydrolysable organomagnesium compound capable of forming a homogeneous polymer layer of magnesium oxyhydroxide by hydrolysis/condensation reaction with water;
(aa) preparing the surface of the substrate to be coated in order to improve the adhesion and/or the electrical insulation and/or the abrasion resistance properties of the magnesium oxide-based insulating layer;
(b') depositing the treatment solution of the hydrolysable organomagnesium compound onto the surface of the substrate, prepared via step (aa), in order to form a magnesium oxide-based layer; and
(c) densifying said layer formed at a temperature of less than or equal to 1000° C. in order to obtain the magnesium oxide-based insulating layer,
wherein said treatment solution further comprises
(i) one or more magnesium salts of formula (II):

$$MgA_2 \quad (II)$$

in which A is a halide ion; and/or (ii) one or more metal or metalloid salts or organometallic compounds of general chemical formula (III):

$$E_t M_u \quad (III)$$

in which:
M is a metal or a metalloid;
E is a group chosen from:
  a hydrolysable group;
  a complexing agent;
  a β-diketone or a derivative of β-diketone;
  a phosphonate;
  a hydroxamate of formula $R^{16}$—CO(NHOH), in which $R^{16}$ is a linear or branched alkyl group having from 1 to 30 carbon atoms or a phenyl group;
  an organosilane;
  a sulphonate;
  a borate; or
  a diol of formula HO—$R^{16}$—OH, in which $R^{16}$ is a linear or branched alkyl group having from 1 to 30 carbon atoms, or a phenyl group, wherein t and u, respectively, represent the stoichiometry of E and M such that the compound (III) is an electrically neutral compound;
in a solvent,
wherein the solvent of the treatment solution is an organic solvent selected from the group consisting of a saturated or unsaturated aliphatic alcohol of formula $R^5$—OH, in which $R^5$ represents an alkyl group having from 1 to 30 carbon atoms, or a phenyl group; and a diol of formula HO—$R^6$—OH, in which $R^6$ represents an alkyl group having from 1 to 30 carbon atoms, or a phenyl group.

* * * * *

UNITED STATES PATENT AND TRADEMARK OFFICE
CERTIFICATE OF CORRECTION

| | | |
|---|---|---|
| PATENT NO. | : 8,821,961 B2 | Page 1 of 1 |
| APPLICATION NO. | : 11/664765 | |
| DATED | : September 2, 2014 | |
| INVENTOR(S) | : Bondoux et al. | |

It is certified that error appears in the above-identified patent and that said Letters Patent is hereby corrected as shown below:

In the Claims,

Claim 1, Column 17, line 11, after "solution", delete "optionally".

Signed and Sealed this
Sixteenth Day of December, 2014

Michelle K. Lee
*Deputy Director of the United States Patent and Trademark Office*